United States Patent [19]

Choi

[11] Patent Number: 5,656,944
[45] Date of Patent: Aug. 12, 1997

[54] BURN-IN VOLTAGE DETECTION CIRCUIT FOR SEMICONDUCTOR CHIP

[75] Inventor: Young-Keun Choi, Kyungki-Do, Rep. of Korea

[73] Assignee: LG Semicon Co., Ltd., Cheongju, Rep. of Korea

[21] Appl. No.: 559,700

[22] Filed: Nov. 15, 1995

[30] Foreign Application Priority Data

Nov. 15, 1994 [KR] Rep. of Korea ............... 29942/1994

[51] Int. Cl.$^6$ ........................................... G01R 31/28
[52] U.S. Cl. ........................................ 324/763; 324/760
[58] Field of Search ............................ 324/763, 158.1, 324/765, 760

[56] References Cited

U.S. PATENT DOCUMENTS 5,068,599  11/1991  Niehaus ........................ 324/158.1
5,349,290  9/1994   Yamada ......................... 324/158.1

Primary Examiner—Kenneth A. Wieder
Assistant Examiner—Anh Phung
Attorney, Agent, or Firm—Fleshner & Kim

[57] ABSTRACT

An improved burn-in voltage detection circuit for a semiconductor chip capable of detecting a predetermined voltage level related to a burn-in operation using a specific element irrespective of manufacturing variation, which includes an external voltage detection circuit for detecting whether an external voltage level is higher than a prescribed internal reference voltage level, and in response producing a burn-in enable signal; and a burn-in conversion detection circuit including a hysteresis characteristic, activated by the burn-in enable signal and responsive to the externally applied voltage and the internal reference voltage, for producing a burn-in signal of a first state as the external voltage is increased in magnitude above the level of the prescribed internal reference voltage by a component of the hysteresis characteristic, and a burn-in signal of a second state as the external voltage is reduced in magnitude below the level of the prescribed internal reference voltage by a component of the hysteresis characteristic.

19 Claims, 5 Drawing Sheets

BURN-IN VOLTAGE DETECTION CIRCUIT FOR SEMICONDUCTOR CHIP

BACKGROUND OF THE INVENTION

1. Field of the Invention

The present invention relates to a burn-in voltage detection circuit for a semiconductor chip, and particularly to an improved burn-in voltage detection circuit for a semiconductor chip capable of detecting a predetermined voltage level related to a burn-in operation using a specific element irrespective of manufacturing variation and advantageously allowing a relationship between a burn-in entry voltage and a burn-in exit voltage to have a predetermined hysteresis characteristic thereby enhancing a normal operation performance thereof and a reliability and stability of a burn-in operation.

2. Description of the Conventional Art

Conventionally, a burn-in operation is performed so as to detect an initial operation defect of a semiconductor chip by applying a predetermined voltage level to a semiconductor chip for a short time and at temperature level higher than that of a normal operation state. An internal voltage generator is in common mounted in a semiconductor chip so as to achieve a lower power consumption and a reliability of the product even in a normal operation, so that the chip can be operable with a predetermined voltage level lower than that of an external voltage applied thereto. The internal voltage generator is directed to maintain a predetermined level of voltage irrespective of a variation of an externally applied voltage in a normal operating state so as to ensure the reliability and operational stability of the chip. Therefore, because a predetermined voltage level higher than that of a normal operation voltage should be applied to all devices in a chip for such a burn-in operation, the internal voltage generator will provide a predetermined voltage level in proportion to a variation of an externally applied voltage when an externally applied voltage exceeds a burn-in entry voltage level. The burn-in voltage detection circuit detects a state where a voltage externally applied to a chip exceeds a predetermined level of a normal operation voltage and reaches to a burn-in entry voltage, and then converts the operation state of the chip into a burn-in operation mode. In addition, in case that an externally applied voltage returns to the normal operation level, the burn-in voltage detection circuit is directed to detect such state and to convert the operational state of the chip into the normal operation mode.

Referring to FIG. 1, a conventional burn-in voltage detection circuit of a semiconductor chip includes a serial array of PMOS transistors 10, in which one side thereof is connected to an externally applied voltage Vdd, an NMOS transistor 11, in which a drain thereof is connected to receive the other side of the PMOS transistor array 10, a source thereof is connected to ground, and a gate thereof receives a reference voltage Vref, a differential amplifier 20 for comparing a voltage outputted from a node N1 connected between the PMOS transistor array 10 and the NMOS transistor 11 with a reference voltage MVA outputted from a reference voltage generating circuit (not shown), a plurality of invertors 30, 40 and 50 in series each inverting an output signal of the differential amplifier 20. Here, a gate of each PMOS transistor of array 10 is connected to its drain.

The differential amplifier 20 includes a pair of PMOS transistors 21 and 22 in which each source thereof is connected to the externally applied voltage Vdd, the gates are connected with each other, and the drains of each is connected to the drain of a corresponding one of a pair of NMOS transistors 23 and 24 described below, an NMOS transistor 23 in which a drain thereof is connected to a drain of the PMOS transistor 21, a source thereof is connected to a drain of an NMOS transistor 25 described below, and a gate thereof receives an output signal of the node N1, an NMOS transistor 24 in which a drain thereof is connected to a drain of the PMOS transistor 22, a source thereof is connected to a drain of the NMOS transistor 25 described below, and a gate thereof receives the reference voltage MVA, and an NMOS transistor 25 in which a drain thereof is commonly connected to each source of the NMOS transistors 23 and 24, a source thereof is connected to ground, and a gate thereof receives a reference voltage BIAS outputted from the reference voltage generating circuit. Here, the gate and drain of the PMOS transistor 21 are connected with each other.

A more detailed operational descriptions of a conventional burn-in voltage detecting circuit is provided below.

When a predetermined voltage Vdd is applied to a semiconductor chip, a voltage MVA which is an internal reference voltage used to drive a memory shell array (not shown), a voltage BIAS which is a predetermined reference voltage for driving an NMOS transistor 25, and a voltage VREF which is a predetermined reference voltage for driving an NMOS transistor 11 are each applied to the burn-in voltage detection circuit. In addition, the reference voltages VREF and BIAS enable the gates of NMOS transistors 11 and 25 to have a predetermined voltage level. At this time, since the NMOS transistor 11 is turned on, the node N1 has a predetermined voltage level Vdd-3|Vtp| lowered by as much as a threshold voltage Vtp of each of the PMOS transistors of the PMOS transistor array 10.

Therefore, the differential amplifier 20 compares the voltage Vdd-3|Vtp| of the node N1 applied to the gate of the NMOS transistor 23 with the reference voltage MVA applied to the gate of the NMOS transistor 24 and then outputs a compared result. If the voltage Vdd-3|Vpt| is smaller than the voltage MVA, the gate-source voltage of the NMOS transistor 23 is smaller than that of the NMOS transistor 24. In this case, the amount of the current flowing toward the transistor 25 through the transistors 22 and 24 is more than that of the current flowing toward the transistor 25 through the transistors 21 and 23. Therefore, the output signal of the differential amplifier 20 is a low level. The output signal of the differential amplifier 20 which is low level is inverted by each of invertors 30 and 40 and outputted as a low level of a signal BINEN signal and outputted as a high level of a signal BINEN through the invertor 50. Thereafter, the semiconductor chip recognizes a current operating state as a normal operation mode and selects an internal voltage using the reference voltage MVA always having a predetermined level of voltage irrespective of a variation of the externally applied voltage and then the internal voltage keeps a predetermined level.

However, if the externally applied voltage Vdd increases and the voltage Vdd-3|Vtp| becomes higher than the voltage MVA, then contrary to the above, the amount of the current flowing toward the transistor 25 through the transistors 21 and 23 is much more than that of the current flowing toward the transistor 25 through the transistors 22 and 24. Therefore, the output signal of the differential amplifier 20 is a high level. The output signal of the differential amplifier 20 is inverted by each of the invertors 30 and 40 and outputted as a high level of the signal BINEN and outputted as a low level of the signal BINEN through the invertor 50. And then, the semiconductor chip recognizes a current operating state as a burn-in operational mode and then selects a voltage in proportion to a variation of the externally applied voltage Vdd as a reference voltage. As a result, the semiconductor chip is converted into a burn-in operation mode and then the burn-in operation is performed.

However, in the conventional burn-in voltage detection circuit, the burn-in voltage is determined by a threshold voltage of the PMOS transistor array 10. Thereafter, if the threshold voltage Vtp of the PMOS transistor array 10 is varied, then the burn-in voltage is varied therealong. In addition, since the burn-in voltage is adjusted by the threshold voltage Vtp, it is difficult to finely adjust the burn-in voltage.

In addition, when the semiconductor chip is converted into the burn-in operational mode from the normal operational mode, the internal voltage increases much more than in the normal operation and then much more current flows from the externally applied element to the internal element for a short time. Thereafter, the voltage drops due to the resistance components in the semiconductor chip and the voltage applied to the semiconductor chip may be lower than the voltage applied from the externally connected element. In this case, if the lowered external voltage is applied to the burn-in voltage detection circuit, the burn-in voltage detection circuit may mistakenly detect that the external voltage is out of the parameters of the burn-in conditions and then may mistakenly exit from the burn-in operation mode and enter into the normal operation mode. If the operating state of the chip is converted into a normal operating mode, the internal voltage of the semiconductor chip keeps a constant voltage level, so the internal voltage drop is reduced and then it causes the operating state of the chip to be converted once again into the burn-in operation mode, whereby an oscillating state in which the burn-in mode is again converted into the normal operational mode due to the internal voltage level reduction may occur.

In addition, since the NMOS transistors 11 and 25 are always turned on due to the reference voltages VREF and BIAS, the power consumption is increased.

SUMMARY OF THE INVENTION

Accordingly, it is an object of the present invention to provide a burn-in voltage detection circuit for a semiconductor chip, which overcomes the problems encountered in the conventional burn-in voltage detection circuit.

It is another object of the present invention to provide an improved burn-in voltage detection circuit for a semiconductor chip capable of detecting a predetermined voltage level related to a burn-in operation using a specific element irrespective of manufacturing variation and advantageously allowing a relationship between a burn-in entry voltage and a burn-in exit voltage to have a predetermined hysteresis characteristic thereby enhancing a normal operation performance and a reliability and stability of a burn-in operation.

To achieve the above objects, in accordance with one aspect of the present invention, there is provided a burn-in voltage detection circuit for a semiconductor chip, which includes an external voltage detection circuit for detecting whether an external voltage level is higher than a prescribed internal reference voltage level, and in response producing a burn-in enable signal; and a burn-in conversion detection circuit including a hysteresis characteristic, activated by the burn-in enable signal and responsive to the externally applied voltage and the internal reference voltage, for producing a burn-in signal of a first state as the external voltage is increased in magnitude above the level of the prescribed internal reference voltage by a component of the hysteresis characteristic, and a burn-in signal of a second state as the external voltage is reduced in magnitude below the level of the prescribed internal reference voltage by a component of the hysteresis characteristic.

To achieve the above objects, in accordance with another aspect of the present invention, there is provided a burn-in voltage detection circuit for a semiconductor chip, which includes an external voltage dividing circuit enabled by the burn-in enable signal for producing a first internal reference voltage that is proportional to the external voltage; an internal reference voltage generating circuit enabled by the burn-in enable signal for producing a second internal reference voltage that is proportional to the external voltage; a burn-in conversion detection circuit including a hysteresis characteristic, enabled by the burn-in enable signal, for producing a burn-in signal of a first state as the first internal reference voltage is increased in magnitude above the prescribed internal reference voltage level by a component of the hysteresis characteristic and a burn-in signal of a second state as the first internal reference voltage is reduced in magnitude below the prescribed internal reference voltage level by a component of the hysteresis characteristic; and an internal reference voltage selection circuit for selecting one of the second internal reference voltage and the prescribed internal reference voltage in response to the state of the burn-in signal.

DETAILED DESCRIPTION OF THE INVENTION

Figure 1:
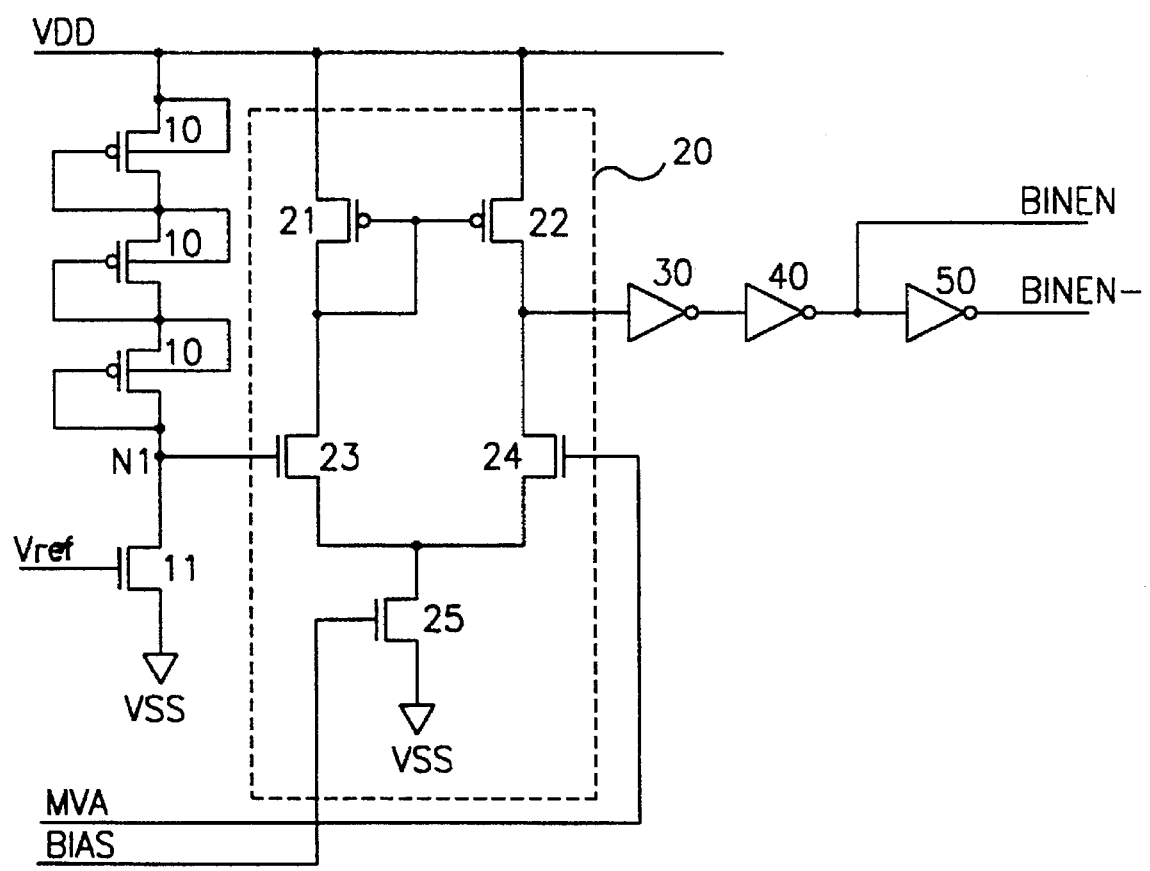
FIG. 1 is a block diagram showing a conventional burn-in voltage detection circuit for a semiconductor chip.
Figure 2:
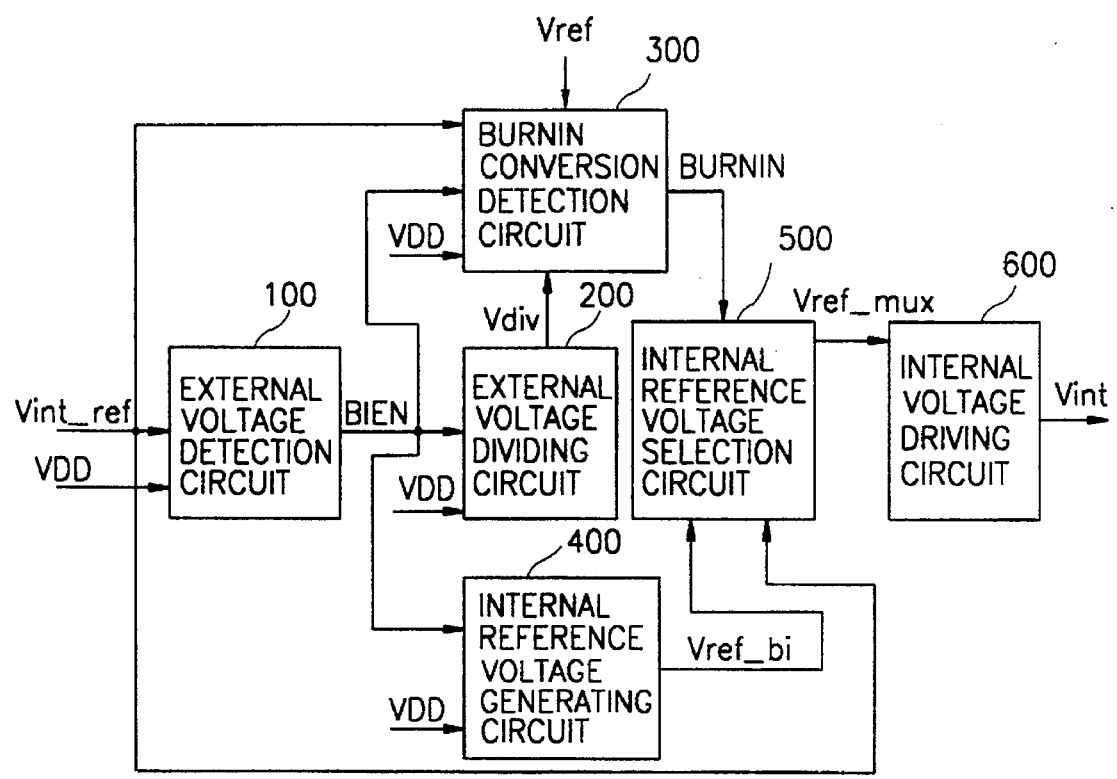
FIG. 2 is a block diagram showing a burn-in voltage detection circuit for a semiconductor chip according to the present invention.

Referring to FIG. 2, there is shown a burn-in voltage detection circuit according to the present invention, which includes an external voltage detection circuit 100 for outputting a burn-in enable signal BIEN by detecting a predetermined level of an external voltage Vdd applied thereto, an external voltage dividing circuit 200 for dividing the external voltage Vdd by the burn-in enable signal BIEN in accordance with a resistance ratio and outputting the divided voltage Vdiv, a burn-in conversion detection circuit 300 for outputting a burn-in signal BURNIN by comparing an internal reference voltage Vint-ref with the divided voltage Vdiv in accordance with the burn-in enable signal BIEN in a normal operation, an internal reference voltage generating circuit 400 for outputting an internal reference voltage Vref-bi in proportion to a variation of the external voltage Vdd in accordance with the burn-in enable signal BIEN at the time of a burn-in operation, an internal reference voltage detection circuit 500 for selecting and outputting the internal reference voltage Vint-ref at the time of a normal operation and the internal reference voltage Vref-bi at the time of a burn-in operation in accordance with the burn-in signal BURNIN, and an internal voltage drive circuit 600 for generating the internal reference voltage Vint and for driving each device in the chip in accordance with an output signal Vref-mux of the internal reference voltage selection circuit 500.

Figure 3:
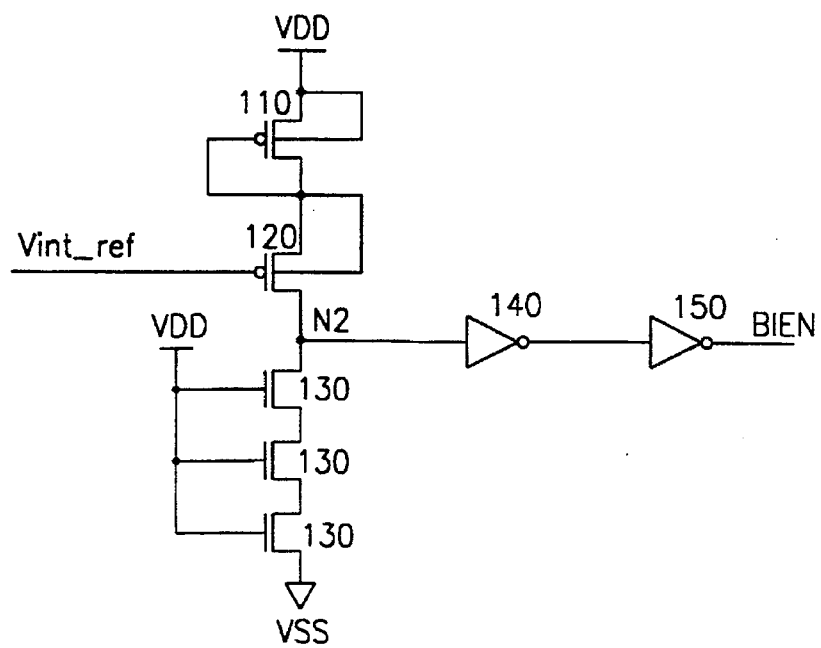
FIG. 3 is a schematic diagram of the an external voltage detection circuit of FIG. 2 according to the present invention.

As shown in FIG. 3, in the external voltage detection circuit 100, an NMOS transistor array 130 consisting of three NMOS transistors and a pair of PMOS transistors 110 and 120 are directly connected in series between the external voltage Vdd and ground. In addition, a gate of the PMOS transistor 110 is connected to a drain thereof, a gate of the PMOS transistor 120 receives an internal reference voltage Vint-ref at the time of a normal operation, and each gate of the NMOS transistor array 130 receives an external voltage Vdd. The burn-in enable signal BIEN is outputted from the node N2 of the connection between the PMOS transistor 120 and the NMOS transistor array 130 through the invertors 140 and 150.

Figure 4:
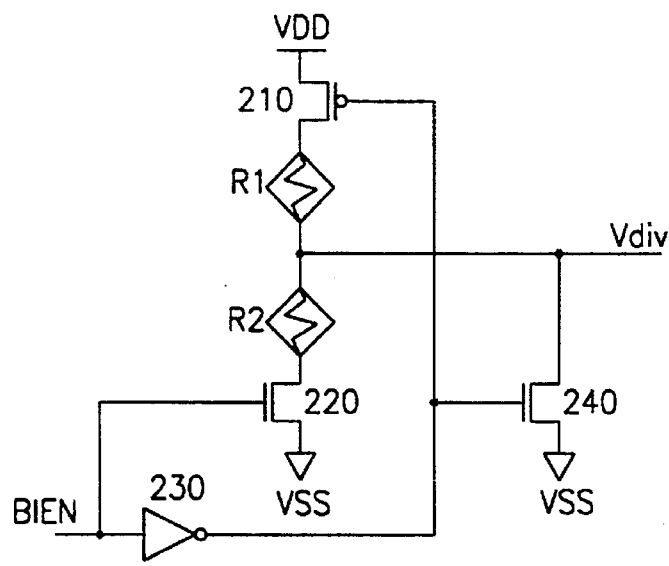
FIG. 4 is a schematic diagram of the external voltage distribution circuit of FIG. 2 according to the present invention.

Referring to FIG. 4, in the external voltage dividing circuit 200, a PMOS transistor 210, series resistances R1 and R2, and an NMOS transistor 220 are directly connected between external voltage Vdd and ground. The burn-in enable signal BIEN from the external voltage detection circuit 100 is applied to a gate of the NMOS transistor 220, and the burn-in enable signal BIEN is inverted by an invertor 230 and then applied to a gate of the PMOS transistor 210. In addition, a signal Vdiv divided at a connection between the resistances R1 and R2 is outputted. An NMOS transistor 240 is connected between the output signal Vdiv and ground. The gate of the NMOS transistor 240 receives the output signal of the invertor 230.

Figure 5:
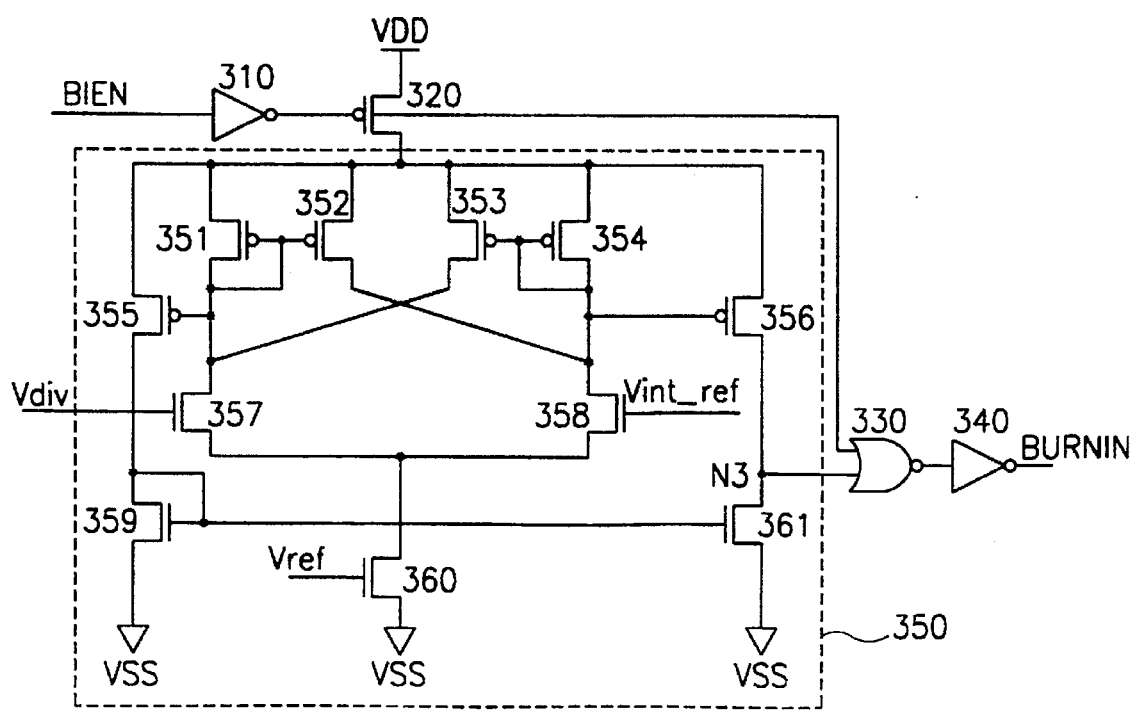
FIG. 5 is a schematic diagram of burn-in conversion detection circuit of FIG. 2 according to the present invention.

The burn-in conversion detection circuit 300 as shown in FIG. 5 includes an invertor 310 for inverting the burn-in enable signal BIEN from the external voltage detection circuit 100, a PMOS transistor 320 for switching the external voltage Vdd in accordance with an output signal of the invertor 310 applied thereto, a differential amplifier 350 for differentially amplifying the voltage Vdiv and an internal reference voltage Vint-ref at the time of a normal operation as the external voltage Vdd is applied thereto through the PMOS transistor 320, a NOR gate 330 for NORing an output signal of the differential amplifier 350 and the output signal of the invertor 310, and an invertor 340 for inverting an output signal of the NOR gate 330 and then outputting an burn-in signal BURNIN.

Figure 6:
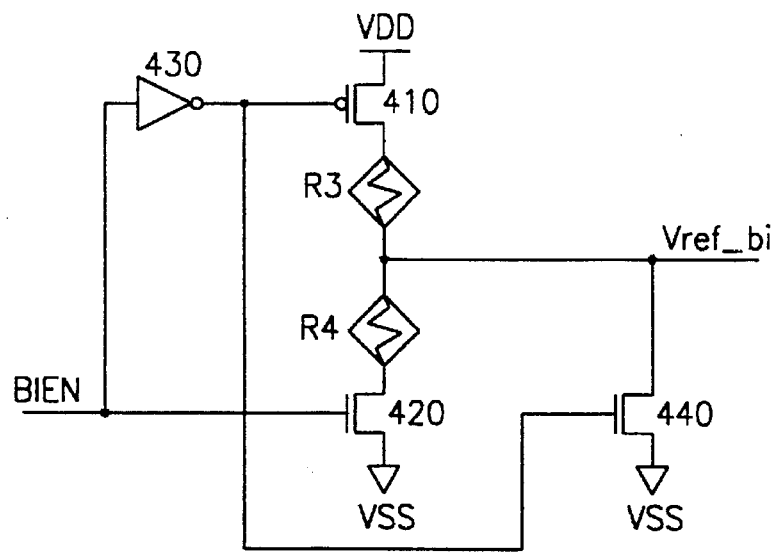
FIG. 6 is a schematic diagram of the internal reference voltage generating circuit of FIG. 2 according to the present invention while in a burn-in operation.

As shown in FIG. 6, the internal reference voltage generating circuit 400 operated at the time of a burn-in has the same construction as the external voltage dividing circuit 200 of FIG. 4 except for the resistance values of the resistances R3 and R4, and outputs the internal reference voltage Vref-bi.

Figure 7:
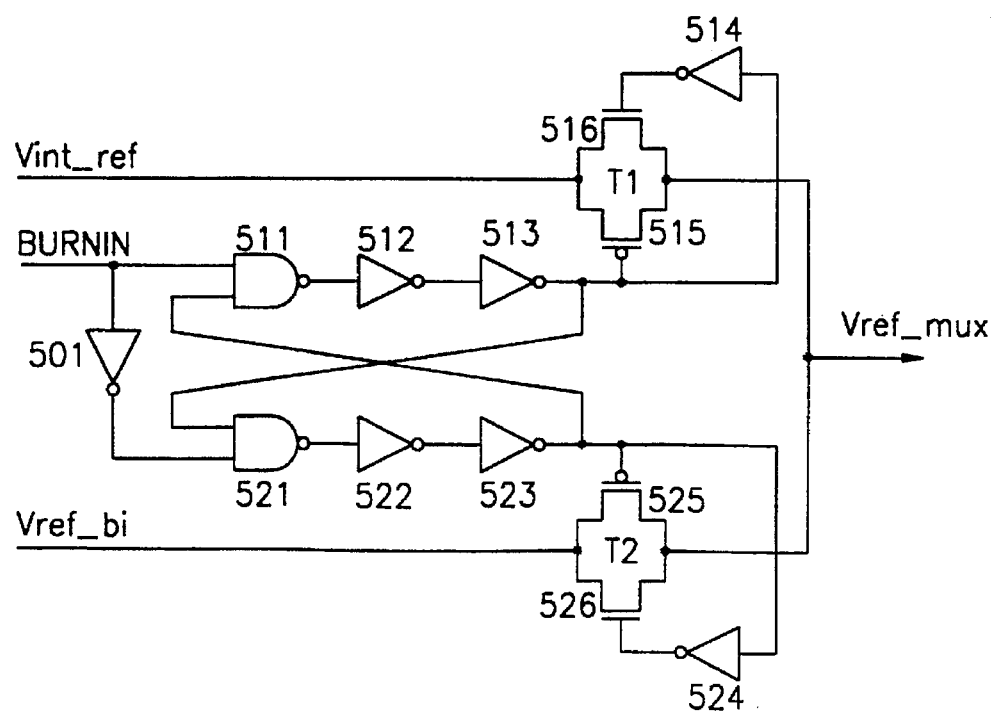
FIG. 7 is a schematic diagram of an internal reference voltage selection circuit of FIG. 2 according to the present invention.

As shown in FIG. 7, the internal reference voltage selection circuit 500 includes a NAND gate 511 for NANDing the burn-in signal BURNIN outputted from the burn-in conversion detection circuit 300 and an output signal of an invertor 523, invertors 512 and 513 for inverting an output signal of the NAND gate 511 in order, a transmission gate T1 for transmitting an internal reference voltage Vint-ref at the time of a normal operation as an output signal of the invertor 513 is applied to a gate of a PMOS transistor 515 thereof and as an inverted signal from the invertor 513 is applied to a gate of an NMOS transistor 516 thereof, an invertor 501 for inverting the burn-in signal BURNIN, a NAND gate 521 for NANDing the output signal of the invertor 501 and the output signal of the invertor 513, invertors 522 and 523 each for inverting an output signal of the NAND gate 521 in order, and a transmission gate T2 for transmitting an internal reference voltage Vref-bi as an output signal of the invertor 523 is applied to a gate of a PMOS transistor 525 thereof and as an output signal of the invertor 523 inverted by an invertor 526 is applied to a gate of an NMOS transistor 526 thereof.

The operation of the burn-in voltage detection circuit for a semiconductor chip according to the present invention will now be explained.

When the external voltage Vdd is applied to the external voltage detection circuit 100 of the burn-in voltage detection circuit, the external voltage detection circuit 100 detects a level of the external voltage Vdd applied thereto. As a result, if the level of the external voltage Vdd conforms with the following expression I, the burn-in enable signal BIEN which is an output signal of the external voltage detection circuit 100 maintains a low level.

$$Vdd < Vint\text{-}ref + 2|Vtp| + \alpha \qquad (I)$$

That is, if the external voltage Vdd applied thereto is smaller than the resultant value obtained by adding the internal reference voltage Vint-ref applied to the gate of the PMOS transistor 120 and a threshold voltage Vtp of the PMOS transistors 110 and 120 and an extra voltage $\alpha$ supplied to the NMOS transistor array 130 which is always turned on as the external voltage Vdd is applied to each gate, the PMOS transistors 110 and 120 are turned off. Therefore, the node N2 has a low level of voltage as the PMOS transistors 110 and 120 are turned off and as the NMOS transistor array 130 is turned on. In addition, the burn-in enable signal BIEN finally outputted as a low level of voltage at the node N2 and passed through the invertors 140 and 150 in order is at a low level. So, the burn-in enable signal BIEN with a low level is outputted from the external voltage detection circuit 100 to the burn-in conversion detection circuit 300, and the external voltage distribution circuit 200 and the internal reference voltage generating circuit 400.

Here, so as to reduce any effects of the voltage at the node N2 due to an extra voltage $\alpha$, the size (W/L)p of the PMOS transistors 110 and 120 should be made big or large. Meanwhile, so as to minimize the power consumption, the size (W/L)n of each transistor of the NMOS transistor array 130 should be made smaller than the size (W/L)p of the PMOS transistors 110 and 120.

Referring to FIG. 4, in the external voltage dividing circuit 200, the burn-in enable signal BIEN with a low level is applied to the gate of the NMOS transistor 220, the burn-in enable signal BIEN inverted by the invertor 230 is applied to the gates of the PMOS transistor 210 and the NMOS transistor 240. Therefore, the PMOS transistor 210 and the NMOS transistor 220 are each turned off, and the NMOS transistor 240 is turned on, and then the output voltage Vdiv of the external voltage dividing circuit 200 is a low level.

Thereafter, in the burn-in conversion detection circuit 300 of FIG. 5, since the burn-in enable signal BIEN inverted to a high level by the invertor 310 is applied to the gate of the PMOS transistor 320, the differential amplifier 450 does not become active since the PMOS transistor 320 is turned off. Thereafter, as the burn-in enable signal with a high level is inputted into one input of the NOR gate 330, the NOR gate 330 outputs a predetermined signal with a low level irrespective of an output signal of the differential amplifier 350 applied to the other input thereof. Since the output signal of the NOR gate 330 is inverted to a high level by the invertor 340, the burn-in conversion detection circuit 300 outputs a burn-in signal BURNIN with a high level.

The internal reference voltage generating circuit 400 operated at the time of a burn-in operation has the same construction as the external voltage dividing circuit 200 of FIG. 4 except for the values of the resistances R3 and R4. So, the internal reference voltage generating circuit 400 outputs the internal reference voltage Vref-bi with a low level as the burn-in enable signal BIEN is inputted thereto.

In the internal reference voltage selection circuit 500, since the burn-in signal BURNIN with a high level is applied thereto from the burn-in conversion detection circuit 300, the invertor 501 inverts the high level thereof to a low level and outputs the inverted signal to the NAND gate 521. As a predetermined signal with a low level is inputted to one input thereof, the NAND gate 521 outputs a predetermined signal with a high level irrespective of the state of a signal inputted to the other input thereof. The output signal of the NAND gate 521 is inverted by the invertors 522 and 523. A predetermined signal with a high level outputted from the invertor 523 is applied to the gate of the PMOS transistor 525 of the transmission gate T2, and a predetermined signal inverted to a low level by the invertor 524 is applied to the gate of the NMOS transistor 526. Therefore, since the transmission gate T2 is turned off, the internal reference voltage Vref-bi is not transmitted.

The NAND gate 511 NANDs an output signal with a high level from the invertor 523 and the burn-in signal BURNIN with a high level and outputs a predetermined signal with a low level. The output signal with a low level from the NAND gate 511 is inverted by the invertors 512 and 513. An output signal with a low level from the invertor 513 is applied to the gate of the PMOS transistor 515 of the transmission gate T1, and a predetermined signal inverted to a high level by the invertor 514 is applied to the gate of the NMOS transistor 516 of the transmission gate T1. Therefore, since the transmission gate T1 is turned on and transmits the internal reference voltage Vint-ref, the internal reference voltage selection circuit 500 selects the internal reference voltage Vint-ref as the output signal Vref-mux.

Therefore, since the internal voltage drive circuit 600 outputs an internal voltage Vint so as to drive a device in the chip with the internal reference voltage Vinf-ref at the time of a normal operation, the internal voltage drive circuit 600 outputs a constant internal voltage Vint irrespective of a variation of the external voltage Vdd. In addition, in this case, since the external voltage dividing circuit 200, the burn-in conversion detection circuit 300, and the internal reference voltage generating circuit 400 operated at the time of a burn-in operation do not become active, the power consumption is reduced.

For example, if the external voltage is 3.3±0.3 V and the internal reference voltage at the time of a normal operation is 2.5 V and the Vtp is 0.8 V, respectively, the value of the "Vint-ref+2|Vtp|+α" becomes "4.1 V+α." At this time, since the maximum value of the external voltage Vdd is 3.6 V, the chip is in a normal operation.

Meanwhile, if conditions of expression II are met as the external voltage Vdd is increased, the burn-in voltage detection circuit is converted into a burn-in ready mode: the burn-in ready mode refers to the predetermined period where each element such as an external voltage dividing circuit 200, the burn-in conversion detection circuit 300, and the burn-in reference voltage detection circuit 400 in the chip become active so as to be converted into a burn-in operational mode.

$$Vdd > Vint\text{-}ref + 2|Vtp| + \alpha \tag{II}$$

In the above case, since the PMOS transistors 110 and 120 of the external voltage detection circuit 100 are turned on, the node N2 has a high level. So, since a signal of the node N2 with a high level is inverted by the invertors 140 and 150, the burn-in enable signal BIEN outputted from the external voltage detection circuit 100 becomes a high level.

Thereafter, in the external voltage dividing circuit 200, since the burn-in enable signal BIEN with a high level is inputted thereto, the NMOS transistor 240 is turned off whereas the PMOS transistor 210 and the NMOS transistor 220 each are turned on. Therefore, the voltage Vdiv outputted from the external voltage dividing circuit 200 is a predetermined voltage in that the external voltage Vdd is divided into a predetermined portion according to the ratio of the resistances R1 and R2.

$$Vdiv = \frac{R2}{(R1+R2)} Vdd = \gamma Vdd \tag{III}$$

In addition, in the internal reference voltage generating circuit 400 operated at the time of a burn-in operation, when the burn-in enable signal BIEN with a high level is inputted thereto, the internal reference voltage Vref-bi which becomes a reference of the internal voltage Vint at the time of a burn-in operation is applied to the internal reference voltage selection circuit 500. At this time, the internal reference voltage Vref-bi is as follows:

$$Vref\text{-}bi = \frac{R3}{(R3+R4)} Vdd \tag{IV}$$

Meanwhile, in the burn-in conversion detection circuit 300, if the voltage Vdiv is smaller than the internal reference voltage Vint-ref that is, in case of "Vdiv<Vint-ref," the burn-in signal BURNIN with a high level is outputted. In the NOR gate 330, since one signal inputted into the one input thereof is a low level signal, the output signal of the NOR gate 330 is determined in accordance with an output signal of the differential amplifier 350.

In the differential amplifier 350, the external voltage Vdd is applied thereto through the turned-on PMOS transistor 320. At this time, if the voltage Vdiv applied to the NMOS transistor 357 is smaller than the voltage Vint-ref applied to the NMOS transistor 358, that is, in case of "Vdiv<Vint-ref," the amount of current flowing toward the NMOS transistors 358 and 360 through the PMOS transistors 352 and 354 is much greater than the amount of current flowing toward the NMOS transistors 357 and 360 through the PMOS transistors 351 and 353. Therefore, since the voltage applied to the gate of the PMOS transistor 355 is a high level, whereas the voltage applied to the gate of the PMOS transistor 356 is a low level, the PMOS transistor 356 is turned on, and the PMOS transistor 355 is turned off. As the PMOS transistor 355 is turned off, the NMOS transistors 359 and 361 are also turned off. Therefore, the output voltage of the differential amplifier 350 outputted from the node N3 becomes a high level and the output voltage thereof is applied to the NOR gate 330. The NOR gate 330 NORs the signal with a high level outputted from the differential amplifier 350 and the signal with a low signal outputted from the invertor 320 and then outputs a low level signal. The output signal of the NOR gate 330 is inverted by the invertor 340 and then the burn-in signal BURNIN with a high level is outputted. Here, the NMOS transistor 360 is always turned on since a reference voltage Vref is applied to a gate thereof.

Thereafter, in the internal reference voltage selection circuit 500, since the burn-in signal BURNIN from the burn-in conversion detection circuit 300 maintains a high level constantly, the internal reference voltage Vint-ref is selected as the output voltage Vref-mux at the time of a normal operation. Therefore, the internal voltage Vint of the chip maintains a constant voltage as long as the voltage Vdiv is not larger than the voltage Vint-ref even though the burn-in ready mode condition is Vdd>Vint-ref+2|Vtp|+α as the external voltage Vdd is increased. In case of the burn-in ready mode, the amount of the current consumption by an active element becomes more than that at the time of a normal operation due to the burn-in enable signal BIEN. However, in the burn-in ready mode, since the external voltage Vdd is out of a range of the external voltage Vdd at the time of a normal operation, the amount of the increased current consumption can be neglected.

As the external voltage Vdd is increased, when the divided voltage Vdiv outputted from the external voltage dividing circuit 200 becomes larger than the internal reference voltage Vint-ref at the time of a normal operation, in the differential amplifier 350 of the burn-in conversion detection circuit 300, the amount of current flowing toward the NMOS transistors 357 and 360 through the PMOS transistors 351 and 353 becomes much more than the amount of current flowing toward the NMOS transistors 358 and 360 through the PMOS transistors 352 and 354.

At this time, the voltage applied to the gate of the PMOS transistor 355 is converted to a low level whereas the voltage applied to a gate of the PMOS transistor 356 is converted to a high level. Therefore, the PMOS transistor 356 is turned off, and the PMOS transistor 355 is turned on. As the PMOS transistor 355 is turned on, the NMOS transistors 359 and 361 each are turned on. Therefore, the voltage outputted from the node N3 is a low level. The NOR gate 330 NORs both the low level signals and outputs a high level signal, and this high level signal is converted to a low level signal by the invertor 340. Therefore, as the external voltage is increased, if the divided voltage Vdiv outputted from the external voltage dividing circuit 200 exceeds the reference voltage Vint-ref, the burn-in conversion detection circuit 300 outputs the burn-in signal BURNIN with a low level to the internal reference voltage selection circuit 500.

In the internal voltage reference selection circuit 500, since the burn-in signal BURNIN with a low level is inputted to the NAND gate 511, the NAND gate 511 outputs a signal with a high level, which is inverted by the invertors 512 and 513. Thereafter, a signal with a high level outputted from the invertor 513 is applied to the gate of the PMOS transistor 515 of the transmission gate T1 and a signal inverted to a low level at the invertor 514 is applied to the gate of the NMOS transistor 516. Thereafter, the signal with a high level outputted from the invertor 513 is inputted to the NAND gate 521. The NAND gate 521 outputs a signal with a low level since the signal applied thereto is a high level. The low level signal outputted from the NAND gate 521 is inverted by the invertors 522 and 523. Therefore, the output signal with a low level from the invertor 523 is applied to the gate of the PMOS transistor 525 of the transmittance gate T2, and a signal inverted to a high level by the invertor 524 is applied to the gate of the NMOS transistor 526, and then the transmission gate T2 is turned on. Therefore, in the internal reference voltage selection circuit 500, as the external voltage Vdd is steadily increased, if the divided voltage Vdiv outputted from the external voltage dividing circuit 200 exceeds the internal reference voltage Vint-ref at the time of a normal operation, the internal reference voltage Vref-bi is selected as the output signal Vref-mux at the time of a burn-in operation. That is, the internal reference voltage selection circuit 500 selects the internal reference voltage Vref-bi in proportion to a variation of the external voltage Vdd at the time of a burn-in operation, not the internal reference voltage Vint-ref which maintains a constant value, at the time of a normal operation, so that the conversion to the burn-in operational mode is obtained.

In particular, the differential amplifier 350 of the barn-in conversion detection circuit 300 has the following conditions in accordance with variations of the divided external voltage Vdiv applied thereto and the internal reference voltage Vint-ref.

$$Vdiv > Vint\text{-}ref + \quad\quad\quad (V)$$

$$\Delta \longrightarrow \text{normal operational mode} \rightarrow \text{burn-in operational mode}$$

$$Vdiv < Vint\text{-}ref - \quad\quad\quad (VI)$$

$$\Delta \longrightarrow \text{burn-in operational mode} \rightarrow \text{normal operational mode}$$

$$Vdd > \frac{1}{\gamma}\ (Vint\text{-}ref + \quad\quad\quad (VII)$$

$$\Delta) \longrightarrow \text{normal operational mode} \rightarrow \text{burn-in operational mode}$$

$$Vdd < \frac{1}{\gamma}\ (Vint\text{-}ref - \quad\quad\quad (VIII)$$

$$\Delta) \longrightarrow \text{burn-in operational mode} \rightarrow \text{normal operational mode}$$

The above expressions VII and VIII are given by adapting the expression III to the expressions V and VI. In the expressions V through VIII, Δ a denotes a voltage determined by a size W/L of the PMOS transistors 351 through 354 of FIG. 5, so it refers to a hysteresis characteristic at a voltage that an operational state of a chip in accordance with a variation of the external voltage Vdd is converted to a burn-in operational mode at the time of a normal operational mode and at a voltage that a burn-in operational mode is converted to a normal operational mode in accordance with a variation of the external voltage Vdd. That is, when a normal operational mode is converted to a burn-in operational mode, the divided voltage Vdiv should be larger than a predetermined value obtained by adding Δ to the internal reference voltage Vint-ref at the time of a normal operation, whereas when a burn-in operational mode is converted to a normal operational mode, the divided voltage Vdiv should be smaller than a predetermined value obtained by subtracting Δ from the internal reference voltage Vint-ref at the time of a normal operation.

Referring to FIG. 5, the output voltage of the external voltage dividing circuit 200 should be higher than the internal reference voltage Vint-ref at the time of a normal operation so that an operational mode of the chip is converted to a burn-in mode from a normal operational mode. At this time, in the current flow at the differential amplifier 350, there is most of the current flowing toward the NMOS transistors 357 and 360 through the PMOS transistors 351 and 353, but a little amount of the current flowing toward the NMOS transistors 358 and 360 through the PMOS transistors 352 and 354 is present therein as well. Therefore, it is necessary that the divided voltage Vdiv should be larger than the voltage "Vint-ref+Δ," not just larger than the internal reference voltage Vint-ref at the time of a normal operation so that converted from the normal operational mode to the burn-in operational mode is obtained. Here, the above considerations apply as well at the time the external voltage is decreased and then goes back from the burn-in operational mode to the normal operational mode.

Subtracting the value of expression VIII from the value of expression VII, the following condition is given:

$$\delta = \frac{2\Delta}{\gamma} \qquad (IX)$$

Therefore, the hysteresis voltage δ of the external voltage due to the difference between the burn-in entry voltage and the burn-in exit voltage is determined by the hysteresis voltage Δ at the differential amplifier 350 of FIG. 5 and the resistances R1 and R2 of FIG. 4.

When the conversion to the burn-in mode is completed, the internal voltage drive circuit 600 drives a device in the chip to be active at a voltage Vref-bi in proportion to a variation of the external voltage. In case that the external voltage falls by more than the hysteresis voltage δ after the operational state of the chip is converted to the burn-in operational mode, it is converted to the normal operational mode.

For example, in a chip where the externally applied voltage Vdd is "3.3 V±0.3 V," assuming that the internal voltage Vint-ref is 2.5 V and the threshold voltage |Vtp| is 0.8 V, then by substituting the values above by the expression IX, the burn-in entry voltage is 4.8 V, the hysteresis voltage δ for the external voltage is 0.5 V, and γ is 0.6 V and the hysteresis voltage Δ at the differential amplifier 350 is 0.15.

In that case, even though the external voltage Vdd increases the internal voltage Vint maintains a constant level due to the driving by the internal reference voltage Vint-ref at the time of a normal operation. When the external voltage Vdd>4.1 V as the external voltage Vdd is continuously increased, the burn-in voltage detection circuit assumes a burn-in ready mode as a result of the expression II condition. In such a period where the external voltage Vdd is less than the burn-in entry voltage 4.8 V at the burn-in ready mode, the internal voltage Vint is maintained at a constant level irrespective of the external voltage Vdd applied thereto. At this time, the burn-in conversion detection circuit 300, the external voltage dividing circuit 200, and the internal reference voltage generating circuit 400 operated at the time of a burn-in each enable elements related to the conversion to the burn-in operational mode to be active and ready for the external voltage increase whereas the internal voltage Vint is maintained at a constant level.

When the external voltage is increased and then becomes Vdd>4.8 V, the burn-in signal BURNIN which is output from the burn-in conversion detection circuit 300 is converted to the low level from the high level, and then the operating state of the chip is converted to the burn-in operational mode. Thereafter, the internal voltage Vint of the chip as described above varies in proportion to a variation of the external voltage Vdd, and then the burn-in operation is performed. The chip converted to the burn-in operational mode is converted to the normal operational mode when the external voltage Vdd is "Vdd<4.3 V" due to the hysteresis characteristic, not "Vdd<4.8 V."

Figure 8:
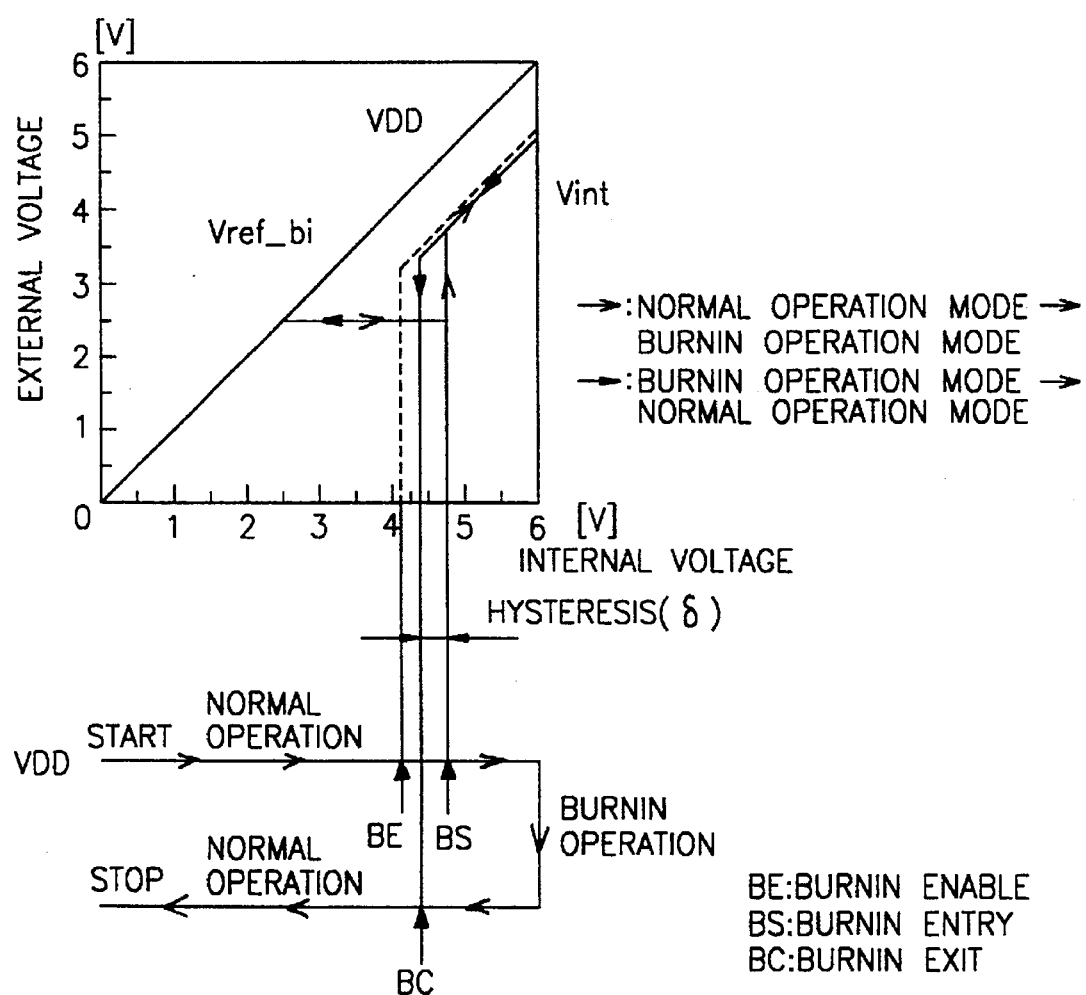
FIG. 8 are respectively a graph and a hysteresis diagram showing a state of an internal voltage in accordance with a change of an external voltage according to the present invention.

FIG. 8 shows a state of an internal voltage variation when the external voltage Vdd varies between 0 V and 6.5 V. The internal voltage keeps a level of 2.5 V until the external voltage becomes 4.1 V. Between the levels of 4.1 V and 4.8 V of the external voltage is a burn-in ready mode. In the burn-in ready mode, the internal voltage Vref-bi increases in proportion to the external voltage applied thereto, however, the chip is driven by an internal voltage Vint of 2.5 V since the internal reference voltage selection circuit 500 selects the internal reference voltage Vint-ref at the time of a normal operation. When the external voltage Vdd reaches at the burn-in entry voltage of 4.8 V, the internal reference voltage selection circuit 500 selects the drive voltage of the chip as the internal reference voltage at the time of a burn-in operation. Therefore, the chip is operated at the burn-in operational mode. The chip entered into the burn-in operational mode performs the burn-in operation continuously until the external voltage falls down below 4.3 V. If the external voltage becomes less than 4.3, the burn-in operational mode is converted to the normal operational mode. Referring to FIG. 8, a predetermined distance between the burn-in entry voltage and the burn-in exit voltage represent a hysteresis voltage of 0.5 V.

Therefore, since the external voltage Vdd should be less than the burn-in entry voltage in consideration of the hysteresis voltage in order that the burn-in operational mode exit back to the normal operational mode, thereby mode oscillation can be avoided.

Whereas the burn-in entry voltage or the burn-in exit voltage is determined by the threshold voltage of the transistors in the conventional art, in the present invention they are determined by the output voltage Vdiv=Vdd*R2(R1+R2) of the external voltage dividing circuit 200 and the internal reference voltage Vint-ref irrespective of the manufacturing variation. Therefore, at a constant voltage, the burn-in voltage can be correctly detected irrespective of the manufacturing variation.

In addition, since the external voltage dividing circuit 200 operated at the time of a normal operation, and the burn-in conversion detection circuit 300 and the internal reference voltage generating circuit 400 become active only at the time of a burn-in operation, the electric power consumption is advantageously reduced.

What is claimed is:

1. A burn-in voltage detection circuit for a semiconductor chip that is responsive to the magnitude of an externally applied voltage for detecting a burn-in mode of operation of the chip, comprising:

an external voltage detection circuit for detecting whether an external voltage level is higher than a prescribed internal reference voltage, and in response, producing a burn-in enable signal; and a burn-in conversion detection circuit including a hysteresis characteristic, activated by said burn-in enable signal and responsive to the externally applied voltage and the prescribed internal reference voltage, for producing a burn-in signal of a first state as the external voltage is increased in magnitude to a first voltage which is above the level of said prescribed internal reference voltage by a component of said hysteresis characteristic, and a burn-in signal of a second state as the external voltage is reduced in magnitude to a second voltage which is below the level of said prescribed internal reference voltage by a component of said hysteresis characteristic, wherein said first voltage and said second voltage are different from each other.

2. The circuit of claim 1, wherein said burn-in signal of the first state signifies a burn-in entry mode.

3. The circuit of claim 1, wherein said burn-in signal of the second state signifies a burn-in exit mode.

4. The circuit of claim 1, wherein said external voltage detection circuit includes:

a first plurality of transistors coupled in series between the external voltage and a first node; and a second plurality of transistors coupled in series between the first node and ground having control electrodes coupled to the externally applied voltage, wherein, the burn-in enable signal is outputted when the externally applied voltage is higher than a summed value of threshold voltages of each of said first plurality of transistors, the internal reference voltage and an extra voltage supplied to said second plurality of transistors.

5. The circuit of claim 1, wherein said burn-in conversion detection circuit includes:

a first transistor activated by an inverted burn-in enable signal;

a differential amplifier having the hysteresis characteristic, activated by said first transistor, for outputting a signal of a first state at a second node as the externally applied voltage is increased in magnitude to the first voltage which is above the level of the prescribed internal reference voltage by the component of said hysteresis characteristic and a signal of a second state at the second node as the externally applied voltage is reduced in magnitude to the second voltage which is below the level of the prescribed internal reference voltage by the component of said hysteresis characteristic; and a first logic gate, responsive to the inverted burn-in signal and the signal from the differential amplifier at the second node, for outputting one of the burn-in signal of the first state and the burn-in signal of the second state.

6. A burn-in voltage detection circuit for a semiconductor chip, comprising:

an external voltage detection circuit for detecting whether an external voltage level is higher than a prescribed internal reference voltage level, and in response producing a burn-in enable signal;

an external voltage dividing circuit enabled by said burn-in enable signal for producing a first internal reference voltage that is proportional to said external voltage;

an internal reference voltage generating circuit enabled by said burn-in enable signal for producing a second internal reference voltage that is proportional to said external voltage;

a burn-in conversion detection circuit including a hysteresis characteristic, enabled by said burn-in enable signal, for producing a burn-in signal of a first state as the first internal reference voltage is increased in magnitude above said prescribed internal reference voltage level by a component of said hysteresis characteristic and a burn-in signal of a second state as the first internal reference voltage is reduced in magnitude below said prescribed internal reference voltage level by a component of said hysteresis characteristic; and an internal reference voltage selection circuit for selecting one of the second internal reference voltage and the prescribed internal reference voltage in response to the state of the burn-in signal.

7. The circuit of claim 6, wherein said internal reference voltage selection circuit is directed to selecting one of the second internal reference voltage and the prescribed internal reference voltage after inactivating a previously selected signal so that said two voltage are prevented from being collided.

8. The circuit of claim 1, further comprising a voltage dividing circuit which is enabled by the burn-in enable signal such that a first internal reference voltage which is proportional to the externally applied signal is produced.

9. The circuit of claim 8, wherein said voltage dividing circuit comprises:

first and second resistors coupled to a third node;

a second transistor coupled to said first resistor and coupled for receiving the externally applied voltage;

a third transistor coupled to said second resistor and coupled to ground; and a fourth transistor coupled between said third node and ground, wherein said second, third and fourth transistors are responsive to the burn-in enable signal.

10. The circuit of claim 1 further comprising an internal reference voltage generating circuit responsive to the burn-enable signal such that a second internal reference voltage proportional to the externally applied voltage is produced.

11. The circuit of claim 10, wherein said internal reference voltage generating circuit comprises:

third and fourth resistors coupled to a fourth node;

a fourth transistor coupled to said third resistor;

a fifth transistor coupled to said fourth resistor; and a sixth transistor coupled to said fourth node, wherein said fourth, fifth and sixth transistors are responsive to the burn-in enable signal.

12. The circuit of claim 10, further comprising a selection circuit responsive to the burn-in signal such that one of the second internal reference voltage and the prescribed internal reference voltage is selected.

13. The circuit of claim 12, wherein said selection circuit comprises:

a first transmission gate coupled for receiving the prescribed internal reference voltage;

a second transmission gate for receiving to the second internal reference voltage; and a logic circuit, responsive to the burn-in signal, for controlling said first and second transmission gates such that one of the prescribed internal reference voltage and second internal reference voltage is outputted.

14. The circuit of claim 6, wherein said external voltage detection circuit includes:

a first plurality of transistors coupled in series between the external voltage and a first node; and a second plurality of transistors coupled in series between the first node and ground having control electrodes coupled to the external voltage, wherein, the burn-in enable signal is outputted when the external voltage is higher than a summed value of threshold voltages of each of said first plurality of transistors, the internal reference voltage and an extra voltage supplied to said second plurality of transistors.

15. The circuit of claim 6, wherein said burn-in conversion detection circuit includes:

a first transistor activated by an inverted burn-in enable signal;

a differential amplifier having the hysteresis characteristic, activated by the first transistor, for outputting a signal of a first state at a second node as the external voltage is increased in magnitude to a first voltage which is above the level of the internal reference voltage by the component of said hysteresis characteristic and a signal of a second state at the second node as the external voltage is reduced in magnitude to a second voltage which is below the level of the internal reference voltage by the component of said hysteresis characteristic; and a first logic gate, responsive to the inverted burn-in signal and the signal from the differential amplifier at the second node, for outputting one of the burn-in signal of the first state and the burn-in signal of the second state.

16. The circuit of claim 6, wherein said differential amplifier comprises:

means for maintaining the burn-in signal at the first state until the first internal reference voltage is equal to the prescribed internal reference voltage level; and means for changing the burn-in signal to the second state when the first internal reference voltage is greater than the prescribed internal reference voltage.

17. The circuit of claim 6, wherein said external voltage dividing circuit comprises:

first and second resistors coupled to a third node;

a second transistor coupled to said first resistor;

a third transistor coupled to said second resistor; and a fourth transistor coupled to said third node and ground, wherein said second, third and fourth transistors are responsive to the burn-in enable signal.

18. The circuit of claim 6, wherein said internal reference voltage generating circuit comprises:

third and fourth resistors coupled to a fourth node;

a fourth transistor coupled to said third resistor;

a fifth transistor coupled to said fourth resistor; and a sixth transistor coupled to said fourth node, wherein said fourth, fifth and sixth transistors are responsive to the burn-in enable signal.

19. The circuit of claim 6, wherein said internal reference voltage selection circuit comprises:

a first transmission gate coupled for receiving the prescribed internal reference voltage;

a second transmission gate for receiving to the second internal reference voltage; and a logic circuit, responsive to the burn-in signal, for controlling said first and second transmission gates such that one of the prescribed internal reference voltage and second internal reference voltage is outputted.

* * * * *